United States Patent [19]
Makino et al.

[11] 3,949,346
[45] Apr. 6, 1976

[54] MAGNETORESISTIVE ELEMENT

[75] Inventors: Yoshimi Makino, Fujisawa; Hideo Hara, Yokohama; Yoshimoto Ohmura, Mitaka, all of Japan

[73] Assignee: Sony Corporation, Tokyo, Japan

[22] Filed: Nov. 13, 1974

[21] Appl. No.: 523,365

[30] Foreign Application Priority Data
Nov. 17, 1973  Japan.............................. 48-129614
Nov. 17, 1973  Japan.............................. 48-129615

[52] U.S. Cl.............. 338/32 R; 323/94 H; 338/287; 338/308
[51] Int. Cl.².......................................... H01C 7/16
[58] Field of Search......... 338/32 R, 32 H, 287, 308; 323/94 H; 324/45, 46; 340/174 EB

[56] References Cited
UNITED STATES PATENTS

| | | | |
|---|---|---|---|
| 3,003,105 | 10/1961 | Kostyshyn.......................... | 338/32 H |
| 3,331,045 | 7/1967 | Weiss et al......................... | 338/32 R |
| 3,835,377 | 9/1974 | Kataoka............................. | 338/32 R |
| 3,848,217 | 11/1974 | Lazzari.............................. | 338/32 R |

Primary Examiner—C. L. Albritton
Attorney, Agent, or Firm—Hill, Gross, Simpson, Van Santen, Steadman, Chiara & Simpson

[57] ABSTRACT

A magnetoresistive element comprising a substrate, a first conducting ferromagnetic film strip having current carrying ability predominantly in one direction, a second current carrying ferromagnetic metal film strip on said substrate having a current carrying ability predominantly in a direction substantially perpendicular to said one direction, said first film strip being spaced from said second film strip by a distance equal to one-half the wave length or multiple thereof of the alternating magnetic field in the magnetoresistive element. The strips are serially connected together and a current input terminal is connected to the opposed end of said strips and an output terminal is connected to the junction between said strips.

Further embodiments of the invention are disclosed in which one film strip is separated from another by a distance equal to a quarter wave length or odd multiple thereof of the alternating magnetic field in the magnetoresistive element. In this form of the invention, the metal film strips are so disposed as to have their respective current carrying ability predominantly in the same direction.

6 Claims, 11 Drawing Figures

MAGNETORESISTIVE ELEMENT

BACKGROUND OF THE INVENTION

It is common practice to detect angular positions of a rotor of a brushless electric motor by means of a magnetoelectric transducer in order to control the currents flowing into the stator coil of the brushless motor. Record players are known which have a plurality of magnets arranged on the periphery of a turntable for speed control. To this end, a magnetic head has been located adjacent to the periphery of the turntable. An alternating magnetic field occurs at the magnetic head with rotation of the turntable. The output signal for one whose frequency is proportional to the rotational speed of the turntable, and this signal has then been applied to a servo-amplifier to control the driving motor of the turntable.

Such a prior art system has the disadvantage that the output signal from the magnetic head is greatly changed with the gap between the magnetic head and the turn table. It is also apt to be affected by a change of temperature and also by an external magnetic field. These disadvantages have been overcome by use of a magnetoresistive element.

CROSS REFERENCE TO RELATED APPLICATIONS

In the Makino, Okamoto and Kamiya application, Ser. No. 487,282, filed July 10, 1974, and assigned to the same assignee as the present invention, a magnetoresistive element is disclosed which comprises an insulating substrate, a first current conducting ferromagnetic metal film strip on the substrate having a current carrying ability predominantly in one direction, a second current carrying ferromagnetic metal film strip on the substrate having a current carrying ability predominantly in a direction substantially perpendicular to the aforementioned direction, with the ends of the strips being connected together, and a current input terminal connected to the opposed ends of the strips, and an output terminal connected to the junction between the two strips. The two strips may be located on the same or on opposite surfaces of the substrate. In this prior application, the two ferromagnetic metal film strips are located in a side-by-side relation on the substrate in such a manner that they are subjected to the same magnetic field.

SUMMARY OF THE INVENTION

The present invention is an improvement over that shown in application, Ser. No. 487,282, and this is accomplished primarily by shifting the relative position of the two magnetoresistive film strip elements so that one is spaced from the other by a half wave length or multiple thereof of the alternating magnetic field to which the elements are subjected when the two film strips are oriented at right angles to each other; or by a quarter wave length or odd multiple thereof when the film strips are oriented parallel to each other.

THE DRAWINGS

Figure 8:
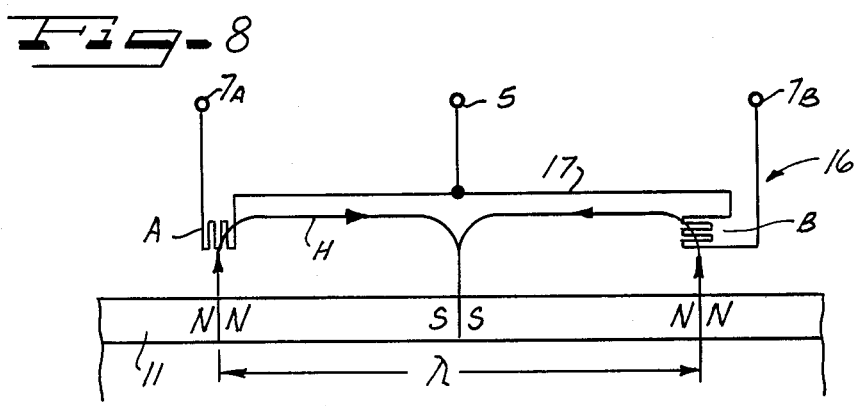
Figure 9:
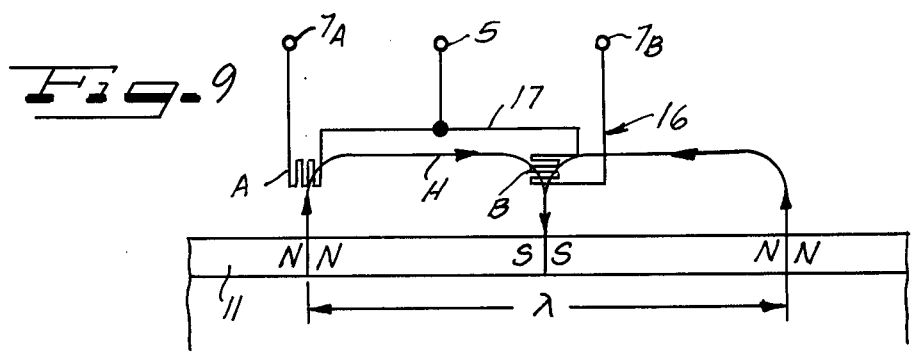
Figure 10:
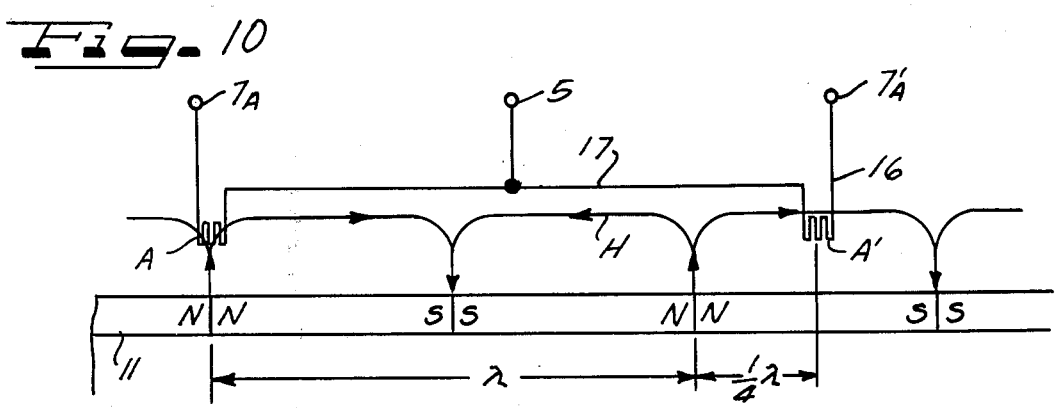
Figure 11:
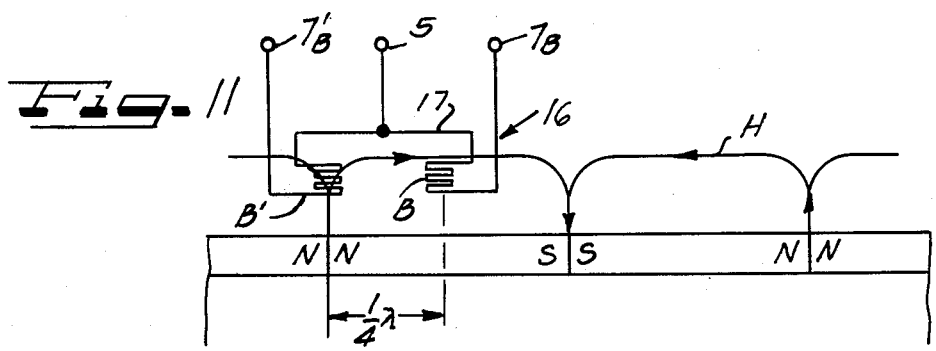

FIGS. 2, 3, 4, 6 and 7 diagrammatically illustrate the functioning and structure of the arrangement disclosed in the said pending application;

FIG. 8 diagrammatically illustrates the separation of the two ferromagnetic film strips by wave length, the two film strips having current carrying ability predominantly in directions at right angles to each other;

FIG. 9 diagrammatically shows a second embodiment of the invention, in which the film strips are spaced from each other by a half wave length; and FIGS. 10 and 11 diagrammatically illustrate arrangements of the magnetoresistive film strips separated from each other by distances equal to one and one-quarter wave length, and one-quarter wave length, respectively, of the alternating magnetic field H of the magnetoresistive element.

DESCRIPTION OF THE PREFERRED EMBODIMENTS

In order to bring out the distinctive improvement of the present invention over that of the prior art, reference will first be made to FIGS. 1 to 4 and 6 to 7 which depict the form of device disclosed in the said copending application, Ser. No. 487,282. As shown particularly in FIG. 1, the magnetoresistive element 1 is provided which comprises a pair of strips A and B formed of a ferromagnetic material having a magnetoresistive effect. The longitudinal direction of the strip A is perpendicular to that of strip B. The strips A and B are connected electrically to each other in series. Current supply terminals 7a and 7b are connected to the opposed ends of the strips A and B. An output terminal 5 is connected to the junction between the strips A and B. A power source 8 is connected between the current supply terminals 7a and 7b. One current supply terminal 7b is connected to ground potential. Thus, a sensing circuit for magnetic fields is obtained.

The ferromagnetic strips A and B have a plurality of main current paths 2A and 2B and associated connecting portions 3A and 3B. The main current paths 2A and 2B are substantially perpendicular to each other. The last current path 4A of the main current path 2A is connected to the first path 4B of the main current paths 2B. The connecting point of the last current path 4A and the first path 4B is connected to a terminal 5.

Figure 1:
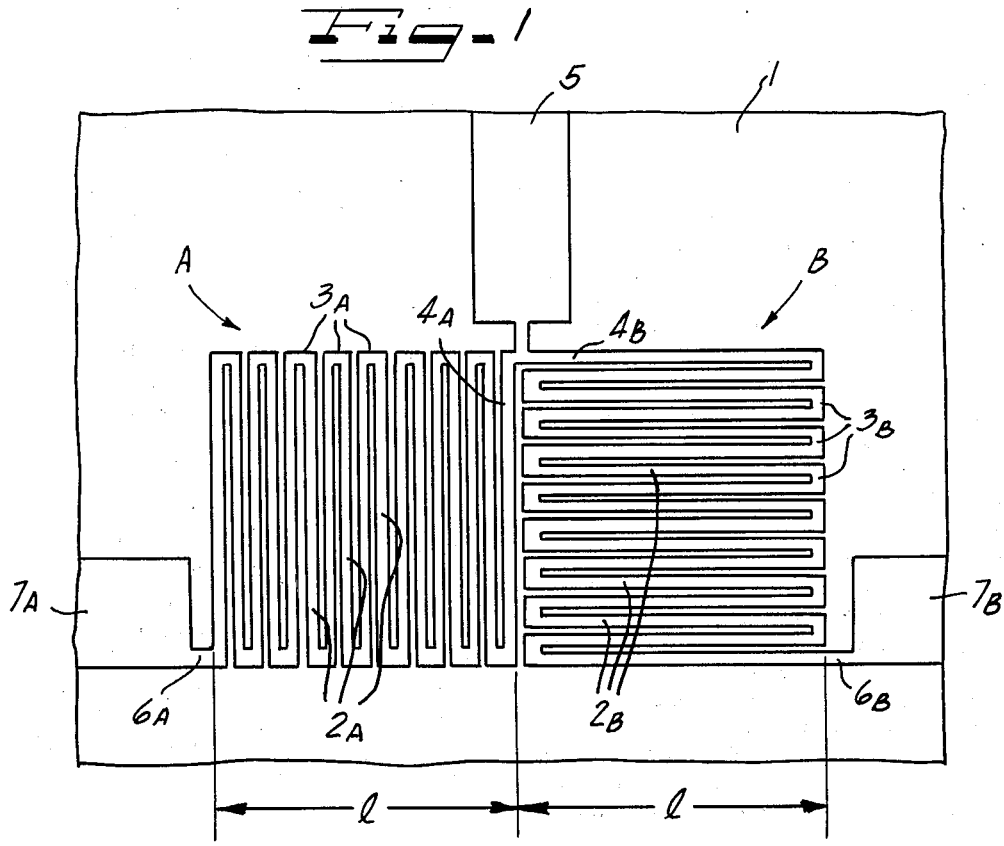
FIG. 1 illustrates a magnetoresistive element which includes two film strips which have current carrying ability predominantly in two directions at right angles to each other respectively and represents the structure disclosed in the said pending application, Ser. No. 487,282.
Figure 2:
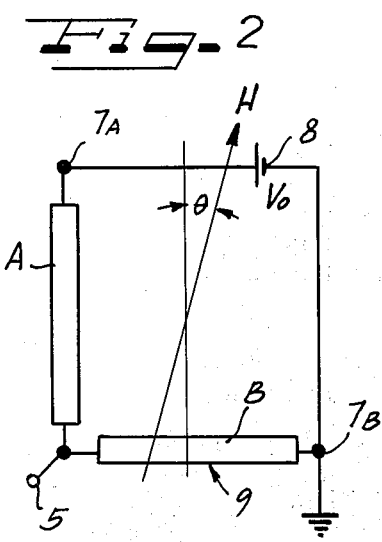
Figure 4:
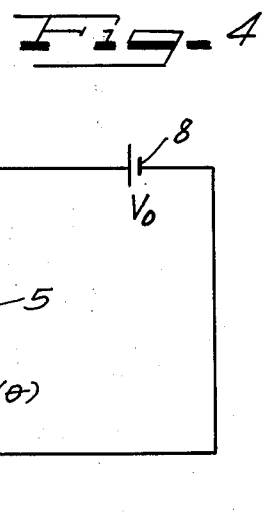
Figure 3:
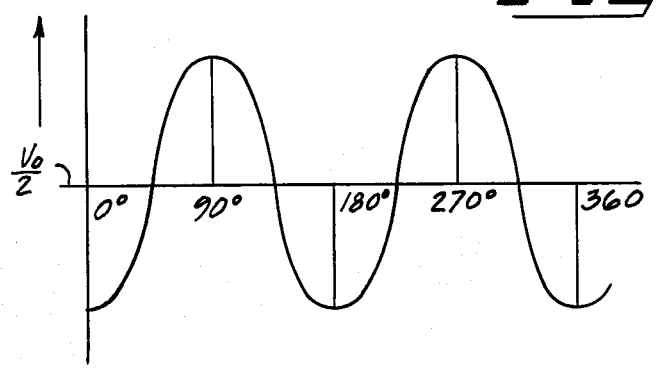

The electric circuit of the arrangement shown in FIG. 1 is diagrammatically shown in FIGS. 2 and 3, where the magnetoresistive elements A and B are serially connected across a battery 8, one side of which is grounded at the terminal 7B. The output terminal 5 is shown connected at the junction between film strips A and B. The magnetic field is indicated by the letter H at one given instant of time. The variation in voltage at the output terminal 5 is shown in FIG. 3.

Figure 5:
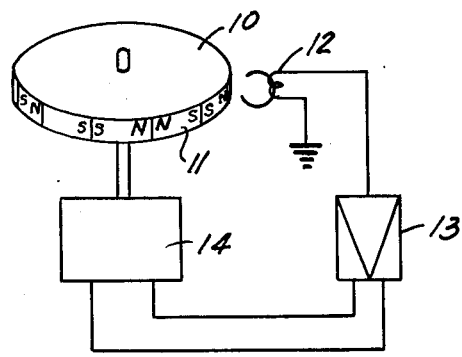
FIG. 5 illustrates a prior art device.

Another prior art form of device is also shown in FIG. 5, where a transducer head 12 is mounted adjacent a turntable 10 which has a plurality of magnetized portions 11 around the periphery thereof so that alternate north and south poles pass the transducer head 12. The output of the transducer head 12 is fed through a servo-amplifier 13 to control the motor 14 which drives the turntable 10.

Figure 6:
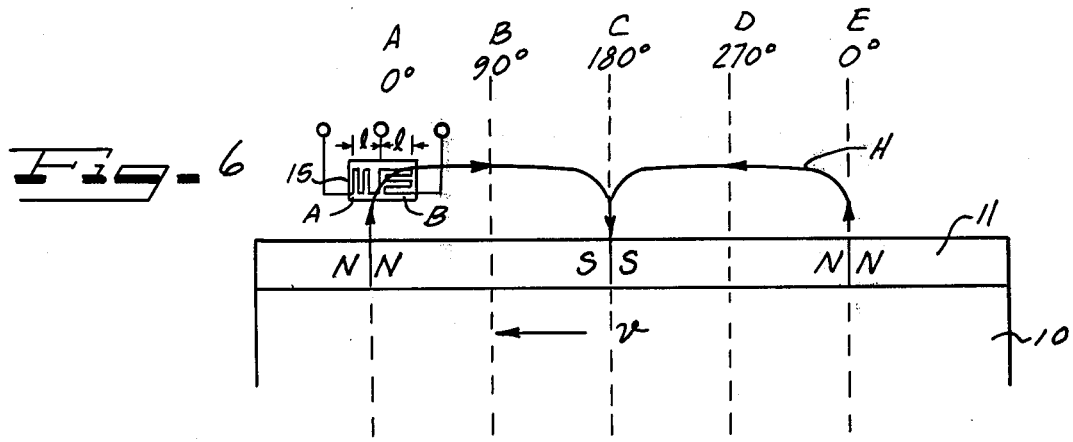
Figure 7:
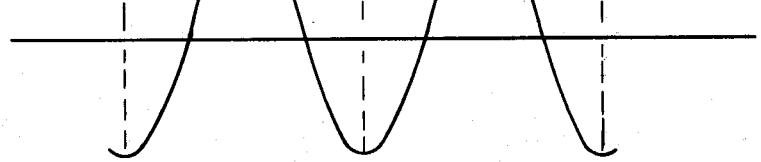

FIG. 6 diagrammatically shows the relationship of the magnetosensitive film strips A and B with respect to the magnetic poles 11 located on the periphery of the turntable 10.

The present invention involves the concept of spacing the film strips apart by a distance of at least one quarter of a wave length or multiple thereof. A first preferred embodiment of the present invention is shown in FIG. 8, wherein the magnetosensitive film strips are separated by the wave length of the alternating magnetic field H in the magnetoresistive element, i.e., by a distance substantially equal to the spacing between two successive north poles. This is diagrammatically shown in FIG. 8, wherein the film strips A and B are separated by a whole wave length. Further, they are electrically connected together across a current source at terminals 7A and 7B. The output terminal is 5.

The film strips A and B are electrically connected together through a conductor 17. The magnetic field is indicated by the line H.

A second embodiment of the invention is shown in FIG. 9, wherein the film strips A and B are separated by a half wave length.

Third and fourth embodiments of the present invention are illustrated in FIGS. 10 and 11, wherein the film strips are separated from each other by one and one-quarter wave lengths and by one-quarter wave length respectively. Similar reference characters have been applied to each of the four embodiments.

With respect to the forms of the invention shown in FIGS. 8 and 9, generally, the one strip A may be distant from the other strip B by $(1/2n)\lambda$, where $n = 0, 1, 2, \ldots$. When $n$ is an even number, the alternating magnetic field H is applied to the strips A and B at the same angle. When $n$ is an odd number, it is applied to the strips A and B at the angles different from each other by 180°. Accordingly, the electrical resistances $\rho A$ and $\rho B$ of the strips A and B are represented by $$\rho A = \rho_\perp \sin^2\theta + \rho_{||} \cos^2\theta \qquad (1)'$$

$$\rho B = \rho_\perp \cos^2(\theta + \pi) + \rho_{||} \sin^2(\theta + \pi) \qquad (2)'$$

Therefore, the output voltage $V'_\theta$ is represented by $$V'_\theta = \frac{\rho B}{\rho A + \rho B} V_o \qquad (3)'$$

$$\rho_\perp \cos^2(\theta+\pi) + \rho_{||} \sin^2(\theta+\pi) = \rho_\perp \cos^2\theta + \rho_{||} \sin^2\theta$$

With particular reference to the embodiments of the invention shown in FIGS. 10 and 11, the one strip A is distant from the other strip A' by a length $\lambda + (1/4)\lambda$, where $\lambda$ represents a wave length of the alternating magnetic field H (FIG. 10). The alternating magnetic field H is applied to the one strip A at an angle 0° and to the other strip A' at another angle 90°, respectively, in FIG. 10.

Generally, the one strip A may be distant from the other strip A' by a length $d = (1/2n)\lambda + (1/4)\lambda$, where $n = 0, 1, 2, \ldots$. When $n$ is 0 or an even number, or the length $d = (1/4)\lambda, 1\frac{1}{4}\lambda, 2\frac{1}{4}\lambda, \ldots$, the following relationships hold good:

$$\rho A = \rho_\perp \cos^2\theta + \rho_{||} \sin^2\theta \qquad (4)'$$

$$\rho A' = \rho_\perp \cos^2\theta' + \rho_{||} \sin^2\theta' \qquad (5)'$$

where $\theta' = \theta + (\pi/2)$.
Therefore, $$\rho A' = \rho_\perp \cos^2(\theta + \frac{\pi}{2}) + \rho_{||} \sin^2(\theta + \frac{\pi}{2}) \qquad (5)''$$

In $0° \leq \theta \leq 90°$ and $180° \leq \theta \leq 270°$, $$\cos(\theta + \frac{\pi}{2}) = -\sin\theta$$

and in $90° \leq \theta \leq 180°$ and $270° \leq \theta \leq 360°$, $$\cos(\theta + \frac{\pi}{2}) = \sin\theta.$$

Therefore, $$\cos^2(\theta + \frac{\pi}{2}) = \sin^2\theta.$$

In $0° \leq \theta \leq 90°$ and $180° \leq \theta \leq 270°$, $$\sin(\theta + \frac{\pi}{2}) = \cos\theta$$

and in $90° \leq \theta \leq 180°$ and $270° \leq \theta \leq 360°$, $$\sin(\theta + \frac{\pi}{2}) = -\cos\theta.$$

Therefore, $$\sin^2(\theta + \frac{\pi}{2}) = \cos^2\theta$$

and the equation (5)'' is the same as the equation (4) for the basic magnetoresistive element.
When $n$ is an odd number, or the length $d = (\frac{3}{4})\lambda, 1\frac{3}{4}\lambda, 2\frac{3}{4}\lambda, \ldots$, the following relationships hold good:

$$\rho A = \rho_\perp \cos^2\theta + \rho_{||} \sin^2\theta \qquad (6)$$

$$\rho A' = \rho_\perp \cos^2\theta'' + \rho_{||} \sin^2\theta'' \qquad (7),$$

where $\theta'' = \theta - (\pi/2)$.
Therefore, $$\rho A' = \rho_\perp \cos^2(\theta - \frac{\pi}{2}) + \rho_\perp \sin^2(\theta - \frac{\pi}{2}) \qquad (7)'$$

In $0° \leq \theta \leq 90°$ and $180° \leq \theta \leq 270°$, $$\cos(\theta - \frac{\pi}{2}) = \sin\theta$$

and

In $90° \leq \theta \leq 180°$ and $270° \leq \theta \leq 360°$, $$\cos(\theta - \frac{\pi}{2}) = -\sin\theta.$$

Therefore, $$\cos^2(\theta - \frac{\pi}{2}) = \sin^2\theta.$$

In $0° \leq \theta \leq 90°$ and $180° \leq \theta \leq 270°$, $$\sin(\theta - \frac{\pi}{2}) = -\cos\theta$$

and

In $90° \leq \theta \leq 180°$ and $270° \leq \theta \leq 360°$, $$\sin(\theta - \frac{\pi}{2}) = \cos\theta.$$

Therefore, $$\sin^2(\theta - \frac{\pi}{2}) = \cos^2\theta$$

and the equation (7)' is the same as the equation (4) for the basic magnetoresistive element.

An electrical conductor 17 connecting the strips A and B is not made of ferromagnetic material.

The above described invention, as represented by the four illustrated embodiments have the following advantages:

1. The frequency of the output from the magnetoresistive element is twice as high as that of the alternating magnetic field. Accordingly, it is easy to design the circuit for the control system;
2. The magnetoresistive element is not affected by the external magnetic field and the temperature;
3. The output voltage from the magnetoresistive element can be increased in comparison with the magnetoresistive element shown in FIG. 1;
4. The magnetoresistive element is improved in the accuracy and the distortion of the wave-form of the output voltage.

It will be noted from the drawings, that in the forms of the invention shown in FIGS. 10 and 11 of the drawings, the two film strips have their current carrying ability predominantly in the same direction.

It will be apparent to those skilled in the art that many modifications and variations may be effected without departing from the spirit and scope of the novel concepts of the present invention.

We claim as our invention:

1. A magnetoresistive element for detecting spaced alternating magnetic fields comprising:
   first and second ferromagnetic strips, each having an anisotropic effect of magnetoresistance and having a main current path portion,
   means for electrically connecting said strips in series, said strips being spaced from each other by a distance equal to ¼ $n\lambda$, where $n$ is an integer, and where $\lambda$ is the wave length of the alternating magnetic field to be detected,
   input terminals connected to the opposed ends of said strips, and
   an output terminal connected to the junction between said strips.

2. A magnetoresistive element according to claim 1, in which said first and second strips are aligned with respect to each other are at right angles when said spacing distance is equal to ½ $n\lambda$.

3. A magnetoresistive element according to claim 1, in which said first and second strips are aligned parallel to each other when said spacing distance is equal to $(2n-1)/(4)\lambda$.

4. In combination a magnetic field supporting means with a plurality of spaced alternating north and south poles, magnetoresistance means for detecting the relative position between said magnetic field supporting means and said detecting means and comprising first and second ferromagnetic strips, each having an anisotropic effect of magnetoresistance and having a main current path portion, means for electrically connecting said strips in series, said strips being spaced from each other by a distance equal to ¼ $n\lambda$, where $n$ is an integer, and where $\lambda$ is the wave length of the alternating north and south poles to be detected, input terminals connected to the opposed ends of said strips, and an output terminal connected to the junction between said strips.

5. A magnetoresistive element according to claim 4, in which the combination of claim 8 wherein said first and second strips are aligned with respect to each other at right angles when said spacing distance is equal to ½ $n\lambda$.

6. A magnetoresistive element according to claim 4 in which the combination of claim 4 wherein said first and second strips are aligned parallel to each other when said spacing distance is equal to $(2n-1)/(4)\lambda$.

* * * * *